United States Patent
Wang et al.

(10) Patent No.: US 10,546,731 B1
(45) Date of Patent: Jan. 28, 2020

(54) METHOD, APPARATUS AND SYSTEM FOR WAFER DECHUCKING USING DYNAMIC VOLTAGE SWEEPING

(71) Applicant: APPLIED MATERIALS, INC., Santa Clara, CA (US)

(72) Inventors: Haitao Wang, Fremont, CA (US); Michael G. Chafin, Santa Clara, CA (US); Kartik Ramaswamy, San Jose, CA (US); Yue Guo, Redwood City, CA (US); Valentin Todorow, Palo Alto, CA (US); Kenny Doan, San Jose, CA (US); Sergio F. Shoji, San Jose, CA (US); Brad L. Mays, Findlay, OH (US); Usama Dadu, Hollister, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/153,650

(22) Filed: Oct. 5, 2018

(51) Int. Cl.
*H01L 21/683* (2006.01)
*H01J 37/32* (2006.01)
*H01L 21/67* (2006.01)
*H01L 21/66* (2006.01)

(52) U.S. Cl.
CPC .. *H01J 37/32697* (2013.01); *H01J 37/32715* (2013.01); *H01L 21/67253* (2013.01); *H01L 21/6831* (2013.01); *H01L 22/14* (2013.01); *H01J 2237/24564* (2013.01); *H01J 2237/3341* (2013.01); *H01L 21/67069* (2013.01)

(58) Field of Classification Search
CPC ............. H01L 21/6833; H01L 21/6831; H01L 21/68742; H01L 21/67259
See application file for complete search history.

(56) References Cited

U.S. PATENT DOCUMENTS

| | | | |
|---|---|---|---|
| 2003/0033116 A1* | 2/2003 | Brcka | H01L 21/6831 |
| | | | 702/182 |
| 2005/0036268 A1 | 2/2005 | Howald et al. | |
| 2009/0097185 A1 | 4/2009 | Shannon et al. | |
| 2010/0208409 A1* | 8/2010 | Bluck | H01L 21/683 |
| | | | 361/234 |
| 2010/0254063 A1 | 10/2010 | Sheng et al. | |
| 2013/0021717 A1 | 1/2013 | Singh | |
| 2013/0059447 A1 | 3/2013 | McMillian et al. | |
| 2013/0153147 A1 | 6/2013 | Senzaki et al. | |

* cited by examiner

*Primary Examiner* — Jaehwan Oh
(74) *Attorney, Agent, or Firm* — Moser Taboada; Alan Taboada (57) ABSTRACT

A method, apparatus and system for dechucking a processing object from a surface of an electrostatic chuck (ESC) in a processing chamber can include applying to the ESC for a first time interval, a first dechuck voltage having a substantially equal magnitude and opposite polarity of a chuck voltage chucking the processing object to the surface of the ESC, selecting a second dechuck voltage having an opposite polarity as the first dechuck voltage, linearly sweeping the ESC voltage from the first dechuck voltage to the second dechuck voltage over a second time interval, monitoring the ESC current during the second time interval until a current spike in the ESC current above a threshold is detected, communicating a command to move support pins up to remove the processing object from the ESC surface, and maintaining the second dechuck voltage until the processing object is separated from the surface of the ESC.

20 Claims, 4 Drawing Sheets

METHOD, APPARATUS AND SYSTEM FOR WAFER DECHUCKING USING DYNAMIC VOLTAGE SWEEPING

FIELD

Embodiments of the present principles generally relate to wafer dechucking and more specifically to a method, apparatus and system for effective dechucking of a processing object using dynamic voltage sweeping.

BACKGROUND

A plasma process is often performed in vacuum by evacuating gas from a processing chamber. In such a process, a processing object is placed on an electrostatic chuck (ESC) that is arranged on a stage of the processing chamber.

The electrostatic chuck includes a conductive sheet-type chuck electrode that is arranged between dielectric members. When performing a plasma process, a voltage from a direct current voltage source is applied to the electrostatic source so that the processing object is chucked to the electrostatic chuck by a Coulomb force generated from the voltage application. After the plasma process is completed, the voltage applied to the electrostatic chuck is typically turned off so that the processing object may be dechucked from the electrostatic chuck. In some instances, to dechuck the processing object, a discharge process is performed, which involves introducing inert gas into the processing chamber to maintain the pressure within the processing chamber at a predetermined pressure level, applying a voltage of the opposite polarity with respect to the voltage applied to the electrostatic chuck during the plasma process, and then turning off the voltage application so that the electric charges of the electrostatic chuck and the processing object may be discharged. Then, support pins are raised so that the processing object may be lifted and dechucked from the electrostatic chuck.

However, the surface of the electrostatic chuck can change over time. For example, foreign substances such as reactive products generated during the plasma process may gradually build up on the surface of the electrostatic chuck to form an insulating film. In such a case, an electric charge may accumulate in the insulating film so that even when the voltage applied to the electrostatic chuck is turned off, a residual electrical charge may remain on the surface of the electrostatic chuck. Such a residual electric charge cannot be discharged by the above discharge process. As a result, the support pins can be raised while an electrostatic suction force created by the residual electric charge still remains on the surface of the electrostatic chuck so that the processing object can crack or be displaced, for example.

SUMMARY

Embodiments of methods, apparatuses and systems for effective dechucking of a processing object, such as a wafer, from an electrostatic chuck using dynamic voltage sweeping are disclosed herein.

In some embodiments a method for dechucking a processing object from a surface of an electrostatic chuck (ESC) in a processing chamber includes applying to the ESC for a first time interval, a first dechuck voltage having a substantially equal magnitude and opposite polarity of a chuck voltage chucking the processing object to the surface of the ESC, selecting a second dechuck voltage having an opposite polarity as the first dechuck voltage, linearly sweeping the ESC voltage from the first dechuck voltage to the second dechuck voltage over a second time interval, monitoring the ESC current during the second time interval until a current spike in the ESC current above a threshold is detected, in response to the detection of the ESC current spike above the threshold, communicating a command to a controller of the processing chamber to move support pins up to remove the processing object from the ESC surface, and maintaining the second dechuck voltage until the processing object is separated from the surface of the ESC.

In some embodiments, an apparatus for dechucking a processing object from a surface of an electrostatic chuck (ESC) in a processing chamber includes a processor, and a memory coupled to the processor, the memory having stored therein at least one of programs or instructions executable by the processor. In some embodiments, the apparatus is configured to apply to the ESC for a first time interval, a first dechuck voltage having a substantially equal magnitude and opposite polarity of a chuck voltage chucking the processing object to the surface of the ESC, select a second dechuck voltage having an opposite polarity as the first dechuck voltage, linearly sweep the ESC voltage from the first dechuck voltage to the second dechuck voltage over a second time interval, monitor the ESC current during the second time interval until a current spike in the ESC current above a threshold is detected, in response to the detection of the ESC current spike above the threshold, communicate a command to a controller of the processing chamber to move support pins up to remove the processing object from the ESC surface, and maintain the second dechuck voltage on the ESC until the processing object is separated from the surface of the ESC.

In some embodiments, a system for dechucking a processing object from a surface of an electrostatic chuck (ESC) in a processing chamber includes a processing chamber including an ESC, and a plurality of support pins, a current monitoring device to monitor a current of the ESC, a voltage source to provide a voltage to the ESC for chucking a processing object to the surface of the ESC, and a system controller comprising a processor and a memory coupled to the processor, the memory having stored therein at least one of programs or instructions executable by the processor. In some embodiments, the system controller is configured to apply to the ESC for a first time interval, a first dechuck voltage having a substantially equal magnitude and opposite polarity of a chuck voltage chucking the processing object to the surface of the ESC, select a second dechuck voltage having an opposite polarity as the first dechuck voltage, linearly sweep the ESC voltage from the first dechuck voltage to the second dechuck voltage over a second time interval, using the current monitoring device, monitor the ESC current during the second time interval until a current spike in the ESC current above a threshold is detected, in response to the detection of the ESC current spike above the threshold, move the plurality of support pins up to remove the processing object from the ESC surface, and maintain the second dechuck voltage on the ESC until the processing object is separated from the surface of the ESC.

Other and further embodiments of the present principles are described below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the present principles and are therefore not to be considered limiting of scope, for the present principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

In the following description, numerous specific details are set forth in order to provide a thorough understanding of exemplary embodiments or other examples described herein. However, these embodiments and examples may be practiced without the specific details. In other instances, well-known methods, procedures, components, and/or circuits have not been described in detail, so as not to obscure the following description. Further, the embodiments disclosed are for exemplary purposes only and other embodiments may be employed in lieu of, or in combination with, the embodiments disclosed. For example, although embodiments of the present principles are described with respect to a specific plasma processing system and corresponding components and wafers, embodiments in accordance with the present principles can be implemented in other hardware devices capable of processing devices, such as substrates and wafers and other processing objects.

Figure 1:
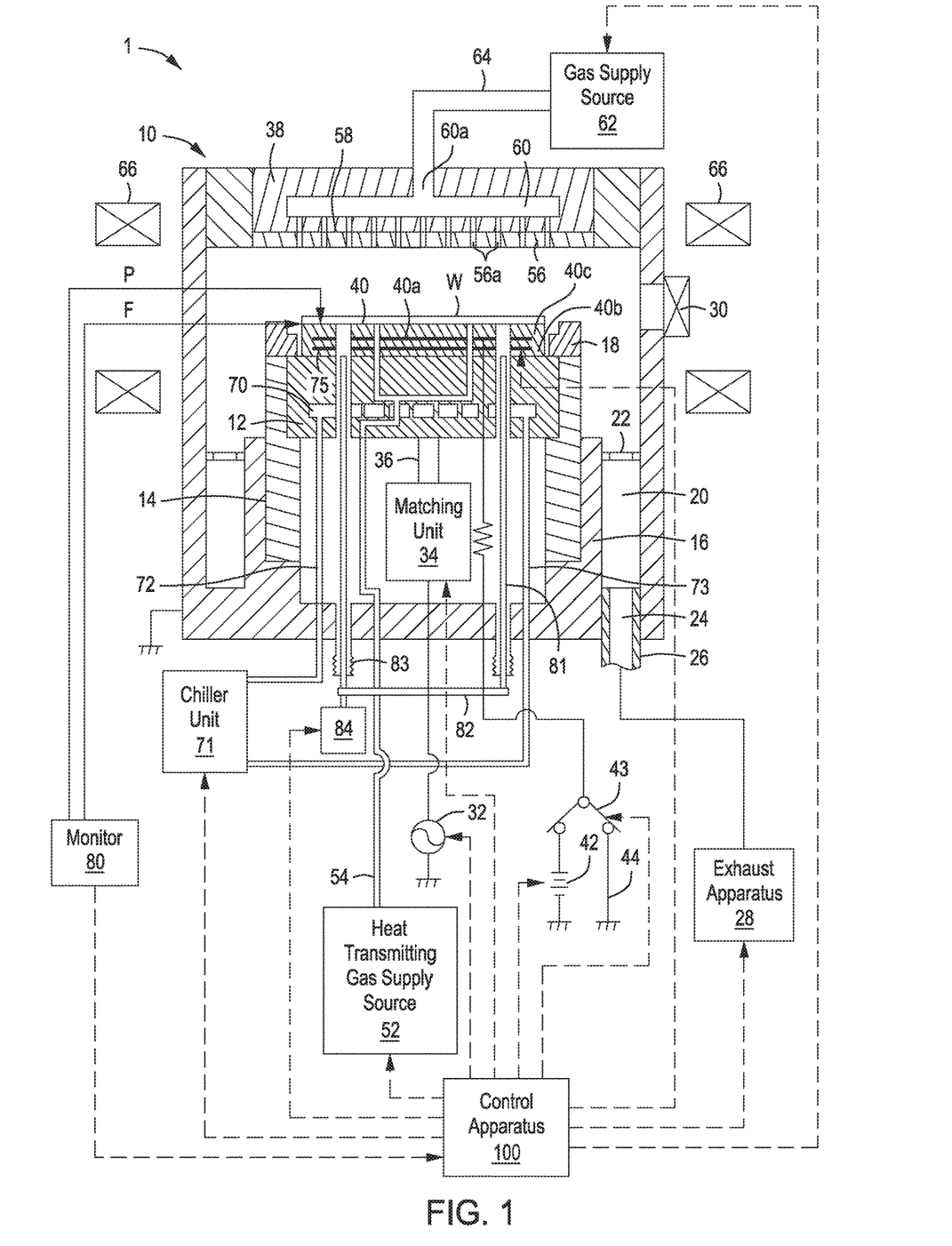
FIG. 1 depicts a high level block diagram of a plasma processing system in which embodiments of the present principles can be applied.

FIG. 1 depicts a high level block diagram of a plasma processing system 1 in which embodiments of the present principles can be applied. The plasma processing system 1 of FIG. 1 illustratively embodies a RIE (reactive-ion etching) type plasma processing system including a cylindrical chamber (processing chamber 10) made of metal such as aluminum or stainless steel, for example. The processing chamber 10 is grounded. The processing chamber 10 of FIG. 1 is depicted with a semiconductor wafer W (referred to as "wafer, W," hereinafter) as a processing object arranged on a stage 12. The stage 12 can be made of aluminum, for example, and is supported by a tubular support 16 extending upward in a perpendicular direction from the bottom of the processing chamber 10 via an insulating tubular holder 14. A focus ring 18 made of quartz, for example, that forms a circle around the top face of the stage 12 is arranged on the top face of the tubular holder 14.

The inner wall of the processing chamber 10 and the outer wall of the tubular support 16 form an exhaust path 20. A circular baffle plate 22 is arranged over the exhaust path 20. An exhaust opening 24 is arranged at the bottom portion of the exhaust path 20 and is connected to an exhaust apparatus 28 via an exhaust pipe 26. The exhaust apparatus 28 includes a vacuum pump (not shown) and is configured to depressurize the interior of the processing chamber 10 to a predetermined degree of vacuum. A gate valve 30 that opens and closes when the wafer, W, is transported into and out of the processing chamber 10 is arranged at the side wall of the processing chamber 10.

The stage 12 is electrically connected to a high-frequency power source 32 for generating plasma via a power feed rod 36 and a matching unit 34. The high-frequency power source 32 can apply a high-frequency electric power of 60 MHz, for example, to the stage 12. In this manner, the stage 12 can also function as a lower electrode. A shower head 38 as an upper electrode at ground potential is arranged at the ceiling portion of the processing chamber 10. The plasma generating high-frequency electric power from the high-frequency power source 32 is capacitively applied between the stage 12 and the shower head 38.

The stage 12 has an electrostatic chuck 40 arranged on its upper face for holding the wafer, W, in place with electrostatic suction force. The electrostatic chuck 40 includes a sheet-type chuck electrode 40a made of a conductive film that is arranged between dielectric layers 40b and 40c corresponding to a pair of dielectric members. A direct current power source 42 is connected to the chuck electrode 40a via a switch 43. When the voltage from the direct current power source 42 is turned on, the electrostatic chuck 40 attracts the wafer, W, with a Coulomb force to hold the wafer, W, in place. When the voltage applied to the chuck electrode 40a is turned off, the direct current power source 42 is connected to a grounding unit 44 by the switch 43. In the following descriptions, it is assumed that when the voltage applied to the chuck electrode 40a is turned off, the chuck electrode 40a is grounded.

A heat transmitting gas supply source 52 supplies a heat transmitting gas such as He gas or Ar gas to the rear face of the wafer, W, that is arranged on the electrostatic chuck 40 via a gas supply line 54. The shower head 38 at the ceiling portion includes an electrode plate 56 having plural gas vent holes 56a and an electrode support 58 that detachably supports the electrode plate 56. A buffer chamber 60 is arranged within the electrode support 58. The buffer chamber 60 includes a gas inlet 60a that is connected to a gas supply source 62 via a gas supply pipe 64. In this way, a desired gas can be supplied to the processing chamber 10 from the shower head 38.

A plurality (illustratively three) support pins 81 (also referred to as lift pins) are arranged within the stage 12 to raise and lower the wafer, W, and transfer the wafer, W, to and from an external transporting arm (not shown). The support pins 81 are driven to move up and down by the power of a motor 84 that is transmitted to the support pins 81 via a connection member 82. The support pins 81 are arranged to penetrate through the processing chamber 10 to the exterior via through holes, and bellows 83 are arranged at the bottom of the through holes in order to maintain the airtight seal of the vacuum within the processing chamber 10 from the external atmosphere.

In the plasma processing system 1 of FIG. 1, a magnet 66 in a two-tier circular or concentric structure is arranged around the processing chamber 10. In a plasma generating space between the shower head 38 and the stage 12 within the processing chamber 10, a vertical RF electric field is created by the high-frequency power source 32 and a high-frequency electric power is discharged so that high density plasma is generated near the surface of the stage 12.

A refrigerant pipe 70 is arranged within the stage 12. A refrigerant at a predetermined temperature is supplied to and circulated within the refrigerant pipe 70 from a chiller unit 71 via pipes 72 and 73. In the embodiment of FIG. 1, a heater 75 is embedded in the electrostatic chuck 40. The heater 75 can have an alternating current voltage applied thereon from an alternating current power source (not shown). In this manner, the processing temperature of the wafer, W, on the electrostatic chuck 40 can be adjusted to a desired temperature through cooling by the chiller unit 71 and heating by the heater 75.

Further, in the embodiment of FIG. 1, a monitor 80 is arranged to monitor the pressure, P, of the heat transmitting gas supplied to the rear face of the wafer, W. The pressure is measured using a pressure sensor (not shown) arranged at the rear face of the wafer, W. The monitor 80 can also monitor the leakage flow rate, F, of the heat transmitting gas leaking from the rear face of the wafer, W. The leakage flow rate can be measured by a flow rate sensor (not shown) that is arranged at a side face of the wafer, W. It is noted that the monitor 80 can be arranged to monitor both the pressure of the heat transmitting gas and the leakage flow rate of the heat transmitting gas, or the monitor 80 can alternatively be arranged to monitor either one of the above.

In the plasma processing system 1 of FIG. 1, a system controller 100 is arranged to control operations of the various units of the plasma processing apparatus 1 such as the gas supply source 62, the exhaust apparatus 28, the heater 75, the direct current voltage source 42, the switch 43, the matching unit 34, the high-frequency power source 32, the heat transmitting gas supply source 52, the motor 84, and the chiller unit 71. Also, the system controller 100 can obtain from the monitor 80, the pressure, P, of the heat transmitting gas supplied to the rear face of the wafer, W, and the leakage flow rate, F, of the heat transmitting gas. Further, the system controller 100 can be connected to a host computer (not shown). In some The system controller 100 includes a CPU (central processing unit), a ROM (read-only memory), and a RAM (random access memory) (not shown), for example. The CPU of the system controller 100 executes a plasma process according to a recipe stored in a memory. The recipe includes apparatus control information specifying processing conditions of the plasma process such as the processing time, the processing chamber temperatures (e.g., upper electrode temperature, processing chamber side wall temperature, ESC temperature), the pressure (e.g., gas exhaust pressure), the high-frequency electric power voltage, the flow rates of various processing gases, and the heat transmitting gas flow rate, for example.

Figure 2:
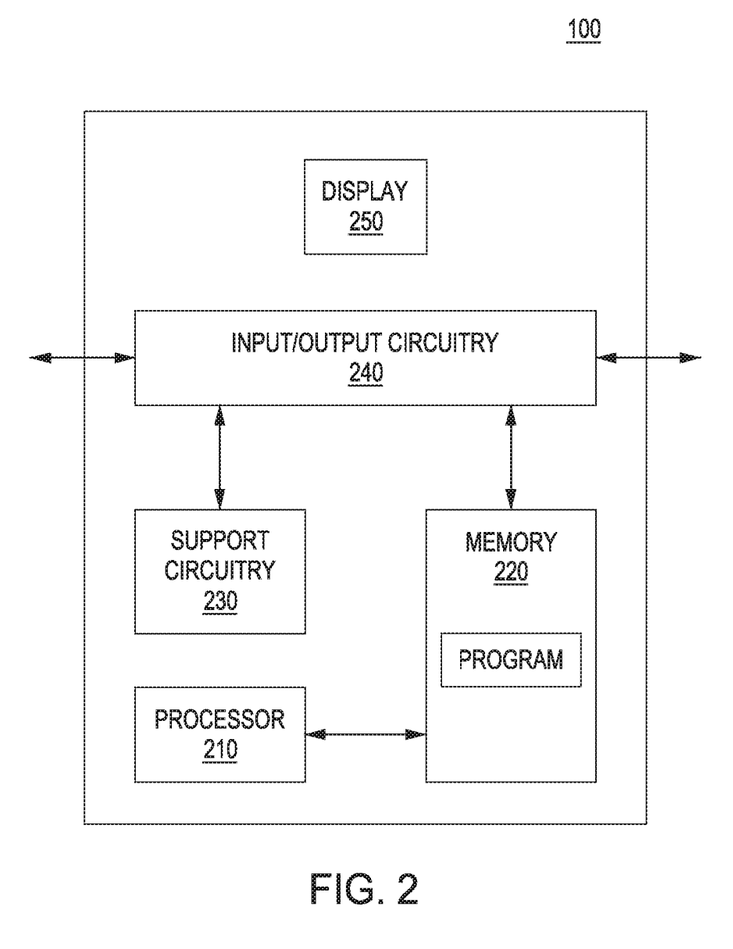
FIG. 2 depicts a high level block diagram of a control apparatus of FIG. 1 in accordance with an embodiment of the present principles.

FIG. 2 depicts a high level block diagram of a system controller 100 of FIG. 1 in accordance with an embodiment of the present principles. The system controller 100 of FIG. 2 illustratively comprises a processor 210, which can include one or more central processing units (CPU), as well as a memory 220 for storing control programs, configuration information, backup data and the like. The processor 210 cooperates with support circuitry 230 such as power supplies, clock circuits, cache memory and the like as well as circuits that assist in executing the software routines/programs stored in the memory 220. As such, some of the process steps discussed herein as software processes may be implemented within hardware, for example, as circuitry that cooperates with the processor 210 to perform various steps. The system controller 100 also contains an input-output circuitry and interface 240 that forms an interface between the various functional elements communicating with the system controller 100. For example, in some embodiments the input-output circuitry and interface 240 can include or be connected to an optional display 250, a keyboard and/or other user input (not shown). The input-output circuitry and interface 240 can be implemented as a user interface for interaction with the system controller 100.

The system controller 100 can communicate with other computing devices based on various computer communication protocols such a Wi-Fi, Bluetooth® (and/or other standards for exchanging data over short distances includes protocols using short-wavelength radio transmissions), USB, Ethernet, cellular, an ultrasonic local area communication protocol, etc. The system controller 100 can further include a web browser.

Although the system controller 100 of FIG. 2 is depicted as a general purpose computer, the system controller 100 is programmed to perform various specialized control functions a specialized, specific computer in accordance with the present principles, and embodiments can be implemented in hardware, for example, as an application specified integrated circuit (ASIC). As such, the process steps described herein are intended to be broadly interpreted as being equivalently performed by software, hardware, or a combination thereof.

Referring back to FIG. 1, to perform etching in the plasma processing system 1 with the above configuration, first, the gate valve 30 is opened so that the wafer, W, held on the transporting arm can be transported into the processing chamber 10. Then, the wafer, W, is raised from the transporting arm by the support pins 81 protruding from the surface of the electrostatic chuck 40 so that the wafer W is held on top of the support pins 81. Then, after the transporting arm exits the processing chamber 10, the support pins 81 are lowered into the electrostatic chuck 40 and the wafer, W, is placed on the electrostatic chuck 40.

After transporting the wafer, W, into the processing chamber 10, the gate valve 30 is closed, an etching gas is introduced into the processing chamber 10 from the gas supply source 62 at a predetermined flow rate, and the pressure within the processing chamber 10 is decreased to a predetermined level by the exhaust apparatus 28. Further, a high-frequency electric power at a predetermined level is applied from the high-frequency power source 32 to the stage 12. Also, a voltage from the direct current voltage source 42 is applied to the chuck electrode 40a of the electrostatic chuck 40 so that the wafer, W, can be fixed to the electrostatic chuck 40. The etching gas that is introduced from the shower head 28 is turned into plasma by the high-frequency electric power from the high-frequency power source 32, and in this manner, plasma can be generated in the plasma generating space between the upper electrode (shower head 38) and the lower electrode (stage 12). As such, a surface of the wafer, W, can be etched by the radicals and ions within the generated plasma.

In accordance with some embodiments of the present principles, to dechuck the wafer, W, from the electrostatic chuck 40 after completing the plasma etching process, a dynamic voltage sweeping process is implemented. For example, when using positive wafer chucking, trapped charges are negative, which generate electrical field at interface of ESC and the wafer, W. When high voltage ESC power supply linearly sweeps voltage from negative to positive over a time interval, a reverse electrical field is created at the wafer/ESC interface. Dynamically the two electrical fields at the wafer/ESC interface cancel each other at some time instant, and the delta voltage is zero volts. So at the specific time instant, zero electrical clamping force holds the wafer to the ESC, which triggers an ESC current spike. Once the occurrence of the ESC current spike signal, support pins can be moved up and the wafer, W, can be safely removed from the ESC surface with minimum stress and no wafer breakage.

Figure 3:
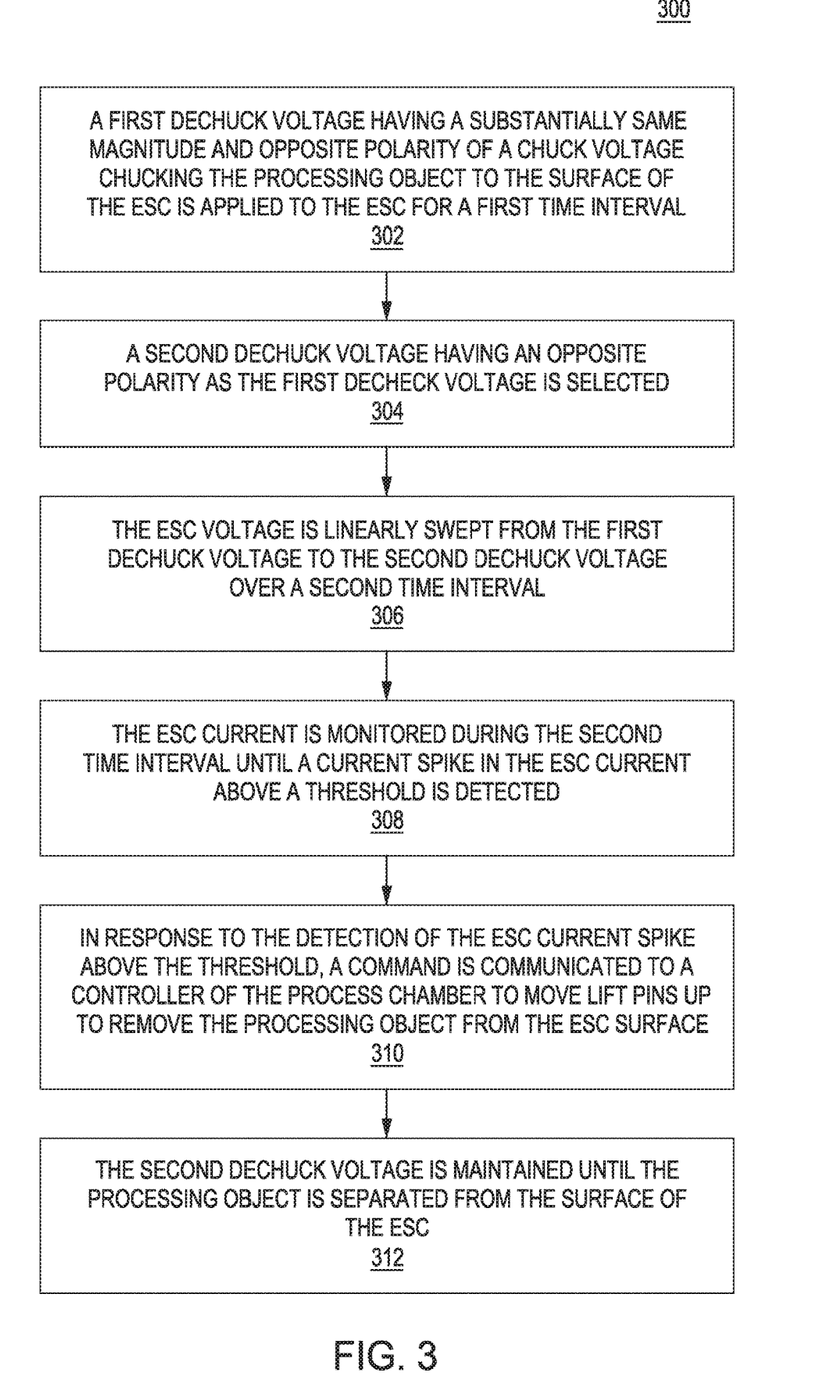
FIG. 3 depicts a flow diagram of a method for dechucking a wafer in accordance with an embodiment of the present principles.

FIG. 3 depicts a flow diagram of a method 300 for dechucking a wafer in accordance with an embodiment of the present principles. The method 300 begins at 302 during which a first dechuck voltage, V1, of substantially equal magnitude and opposite polarity of a chuck voltage chucking a wafer to an electrostatic chuck (ESC) is applied to the ESC for a first time interval, T1. In the method 300 of FIG. 3, it is assumed that wafers are positively chucked during a wafer process. As such, a negative first dechuck voltage, V1, is applied to the ESC used to chuck the wafer, W, for a first time interval of T1. In some embodiments in accordance with the present principles, the first dechuck voltage, V1 can have a polarity opposite of the chuck voltage and a magnitude substantially equal to the chuck voltage and can be provided by the power source 42 depicted in the plasma processing system 1 of FIG. 1. In other embodiments, the first dechuck voltage can be provided by a separate power source (not shown). In addition, in some embodiments in accordance with the present principles, T1 can be selected as a shortest time that enables the wafer to discharge in preparation to dechuck. In some other embodiments, T1 can be selected as any time that enables the wafer to discharge. The method 300 can proceed to 304.

At 304, a second dechuck voltage, V2, having an opposite polarity as the first dechuck voltage is selected. In the embodiment of FIG. 3, a positive dechuck voltage, V2, is selected. The magnitude of V2 can be selected as the voltage that the dechuck plasma condition produces naturally on the wafer at the end of the dechuck sequence of 304. That is, in some embodiments the magnitude of V2 can be selected as equal in magnitude to a voltage that a plasma in the processing chamber 10 produces on the wafer, W, during the application of the first dechuck voltage to the wafer, W. In some embodiments in accordance with the present principles, V2 can be provided by the power source 42 depicted in the plasma processing system 1 of FIG. 1. In other embodiments, the first dechuck voltage can be provided by a separate power source (not shown). The method 300 can proceed to 306.

At 306, the ESC voltage is linearly swept from V1 to V2 over a second time interval, T2. T2, the sweep time, can be selected such that the controller has enough time to acquire, monitor, and process the signals needed to determine a dechuck condition of the wafer. More specifically T2 is selected to enable the detection of the current spike in 308. The method 300 can proceed to 308.

At 308, the ESC current is monitored during the voltage sweeping time, T2, until a current spike in the ESC current above a threshold is detected. In some embodiments a current spike level can be as low as several micro amperes above a stable current level during the linear voltage sweep from V1 to V2 over T2. For example, in one embodiment, a current spike can be between 1 to 10 micro amperes above a stable current level. An important aspect is that the current spike is able to be detected by a current monitoring device implemented to detect the current spike. In some embodiments in accordance with the present principles, the ESC current can be monitored by the power source 42 depicted in the plasma processing system 1 of FIG. 1 having current monitoring capabilities. In other embodiments, the ESC current can be monitored by a separate current monitoring device (not shown). The method 300 can proceed to 310.

At 310, in response to the detection of the ESC current spike above the threshold, a command is communicated to move up the support pins 81 of the processing chamber 10 to remove the wafer, W, from the ESC surface. More specifically, in some embodiments in accordance with the present principles, the monitored current levels of 308 can be communicated to the system controller 100. Upon detecting that a current spike is above a determined threshold, the system controller 100 can communicate a command to the processing chamber 10 to move up the support pins 81 to remove the wafer, W, from the ESC surface. In some other embodiments in accordance with the present principles, the power source 42 depicted in the plasma processing system 1 of FIG. 1 includes control capabilities and, upon detecting that a current spike is above a determined threshold, the power source 42 can communicate a command to the processing chamber 10 to move up the support pins 81 to remove the wafer, W, from the ESC surface. The method 300 can proceed to 312.

At 312, the second dechuck voltage, V2, is maintained until the wafer, W, is separated from the surface of the ESC. In the embodiment of FIG. 3, the positive dechuck voltage, V2, is maintained until the wafer, W, is separated from the ESC surface. The method 300 can then be exited.

Figure 4:
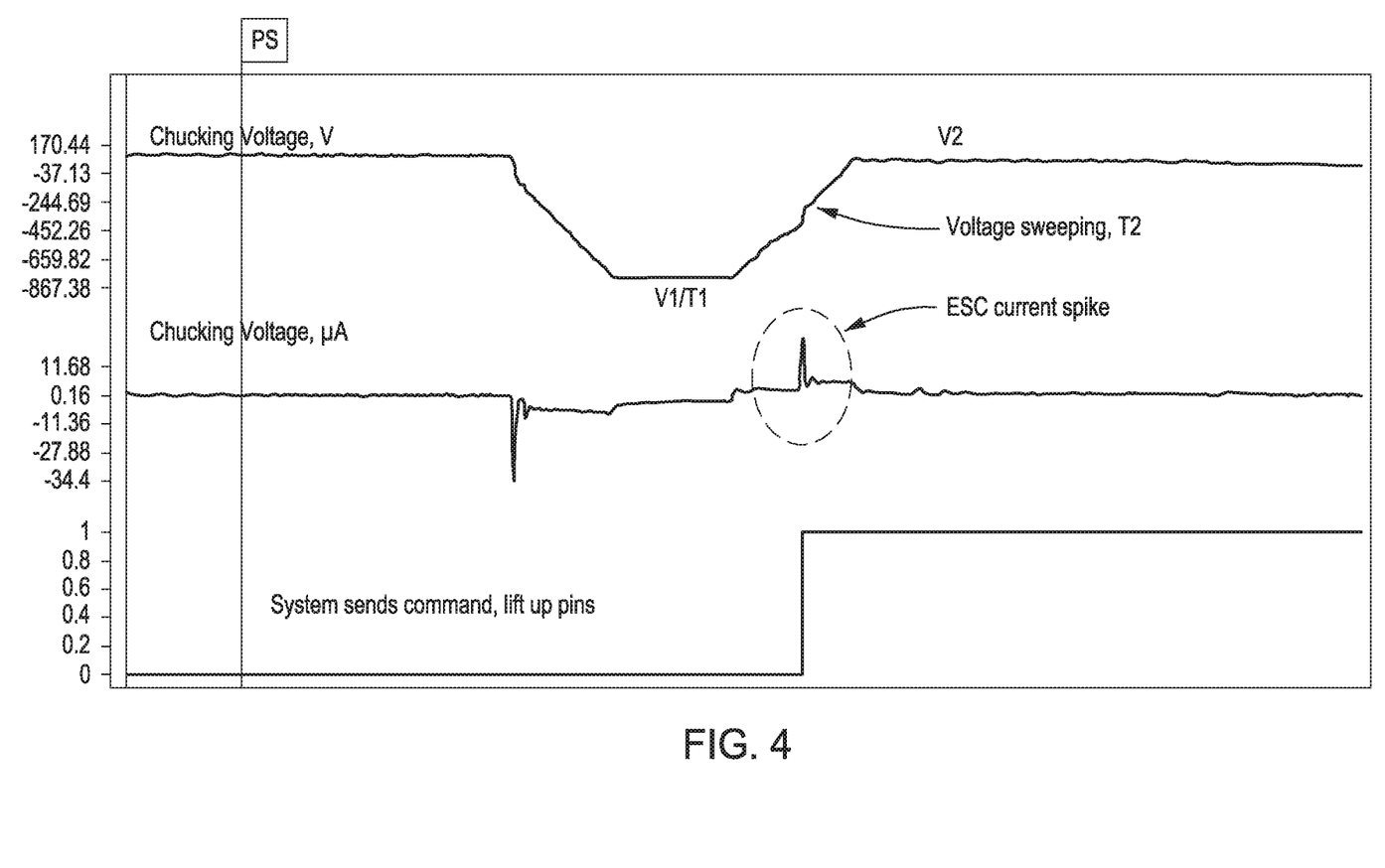
FIG. 4 depicts a timing diagram of the method of FIG. 3, in accordance with an embodiment of the present principles.

FIG. 4 depicts a timing diagram of the method 300 of FIG. 3, in accordance with an embodiment of the present principles. As depicted in the top line of the timing diagram of FIG. 4, a negative voltage, V1, is applied to a positively biased ESC for a time period, T1, as described above. After the time period, T1, a positive dechuck voltage, V2, is selected and the voltage applied to the ESC is swept from V1 to V2 over time interval, T2, as described above.

The ESC current is monitored during the voltage sweeping time, T2, until a current spike in the ESC current above a threshold is detected. The middle line of the timing diagram of FIG. 4 depicts the occurrence of the current spike in the ESC current. As depicted in the bottom line of the embodiment of FIG. 4 and with reference to the plasma processing system 1 of FIG. 1, at the occurrence of the current spike in the ESC current, a command is communicated using, for example the control apparatus 100 to the processing chamber 10 to move the support pins 81 up to remove the wafer, W, from the surface of the ESC 40.

While the foregoing is directed to embodiments of the present principles, other and further embodiments may be devised without departing from the basic scope thereof. For example, the various devices, modules, etc. described herein can be enabled and operated using hardware circuitry, firmware, software or any combination of hardware, firmware, and software (e.g., embodied in a machine-readable medium).

In addition, it can be appreciated that the various operations, processes, and methods disclosed herein can be embodied in a machine-readable medium and/or a machine accessible medium compatible with a data processing system (e.g., a computer system), and can be performed in any order (e.g., including using means for achieving the various operations). Accordingly, the specification and drawings are to be regarded in an illustrative rather than a restrictive sense. In some embodiments, the machine-readable medium can be a non-transitory form of machine-readable medium.

In the foregoing description, numerous specific details, examples, and scenarios are set forth in order to provide a more thorough understanding of the present principles. It will be appreciated, however, that embodiments of the principles can be practiced without such specific details. Further, such examples and scenarios are provided for illustration, and are not intended to limit the teachings in any way. Those of ordinary skill in the art, with the included descriptions, should be able to implement appropriate functionality without undue experimentation.

References in the specification to "an embodiment," etc., indicate that the embodiment described may include a particular feature, structure, or characteristic, but every embodiment may not necessarily include the particular feature, structure, or characteristic. Such phrases are not necessarily referring to the same embodiment. Further, when a particular feature, structure, or characteristic is described in connection with an embodiment, it is believed to be within the knowledge of one skilled in the art to effect such feature, structure, or characteristic in connection with other embodiments whether or not explicitly indicated.

Modules, data structures, blocks, and the like are referred to as such for ease of discussion, and are not intended to imply that any specific implementation details are required. For example, any of the described modules and/or data structures can be combined or divided into sub-modules, sub-processes or other units of computer code or data as may be required by a particular design or implementation of the control apparatus 100.

The invention claimed is:

1. A method for dechucking a processing object from a surface of an electrostatic chuck (ESC) in a processing chamber, comprising:
   applying to the ESC for a first time interval, a first dechuck voltage having a substantially equal magnitude and opposite polarity of a chuck voltage chucking the processing object to the surface of the ESC;
   selecting a second dechuck voltage having an opposite polarity as the first dechuck voltage;
   linearly sweeping the voltage on the ESC from the first dechuck voltage to the second dechuck voltage over a second time interval;
   monitoring a current of the ESC during the second time interval until a spike in the current of the ESC above a threshold is detected;
   in response to the detection of the spike in the current of the ESC above the threshold, communicating a command to a controller of the processing chamber to move up pins supporting the processing object to remove the processing object from the surface of the ESC; and
   maintaining the second dechuck voltage until the processing object is separated from the surface of the ESC.

2. The method of claim 1, comprising applying the first dechuck voltage to the ESC for a shortest time interval that enables the processing object to discharge the chuck voltage.

3. The method of claim 1, comprising selecting the second dechuck voltage as a voltage opposite in polarity and substantially equal in magnitude to a voltage that a plasma in the processing chamber produces on the processing object during the application of the first dechuck voltage to the processing object.

4. The method of claim 1, comprising linearly sweeping the voltage on the ESC from the first dechuck voltage to the second dechuck voltage over a time interval long enough to enable a detection of a dechuck condition of the processing object.

5. The method of claim 4, wherein the dechuck condition is identified by a current spike in the monitored current of the ESC.

6. The method of claim 1, wherein the threshold for the spike in the current of the ESC comprises a current level at least several microamperes above a stable current level during the linear voltage sweep.

7. An apparatus for dechucking a processing object from a surface of an electrostatic chuck (ESC) in a processing chamber, comprising:
   a processor; and
   a memory coupled to the processor, the memory having stored therein at least one of programs or instructions executable by the processor to configure the apparatus to:
   apply to the ESC for a first time interval, a first dechuck voltage having a substantially equal magnitude and opposite polarity of a chuck voltage chucking the processing object to the surface of the ESC;
   select a second dechuck voltage having an opposite polarity as the first dechuck voltage;
   linearly sweep the voltage on the ESC from the first dechuck voltage to the second dechuck voltage over a second time interval;
   monitor a current of the ESC during the second time interval until a spike in the current of the ESC above a threshold is detected;
   in response to the detection of the spike in the current of the ESC above the threshold, communicating a command to a controller of the processing chamber to move up pins supporting the processing object to remove the processing object from the surface of the ESC; and
   maintain the second dechuck voltage until the processing object is separated from the surface of the ESC.

8. The apparatus of claim 7, wherein the apparatus comprises a power source.

9. The apparatus of claim 7, wherein the apparatus comprises a controller capable of controlling an output of a power source.

10. The apparatus of claim 7, wherein the first dechuck voltage is provided by a power source providing the chuck voltage chucking the processing object to the surface of the ESC.

11. The apparatus of claim 10, wherein the power source applies the first dechuck voltage to the ESC for a shortest time interval that enables the processing object to discharge the chuck voltage.

12. The apparatus of claim 7, wherein the second dechuck voltage is provided by a power source providing the chuck voltage chucking the processing object to the surface of the ESC.

13. The apparatus of claim 12, wherein the power source selects the second dechuck voltage as a voltage opposite in polarity and substantially equal in magnitude to a voltage that a plasma in the processing chamber produces on the processing object during the application of the first dechuck voltage to the processing object.

14. The apparatus of claim 7, wherein the apparatus comprises a power source having current monitoring capabilities.

15. The apparatus of claim 7, wherein the apparatus comprises a controller capable of causing pins of the processing chamber supporting the processing object to move up to remove the processing object from the surface of the ESC.

16. The apparatus of claim 7, wherein the threshold for the spike in the current of the ESC comprises a current level at least several microamperes above a stable current level during the linear voltage sweep.

17. A system for dechucking a processing object from a surface of an electrostatic chuck (ESC) in a processing chamber, comprising:
   a processing chamber comprising an ESC, and a plurality of support pins to support the processing object;
   a current monitoring device to monitor a current of the ESC;
   a power source to provide a voltage to the ESC; and a system controller comprising a processor and a memory coupled to the processor, the memory having stored therein at least one of programs or instructions executable by the processor to configure the system controller to:
apply to the ESC for a first time interval, a first dechuck voltage from the power source having a substantially equal magnitude and opposite polarity of a chuck voltage chucking the processing object to the surface of the ESC;
select a second dechuck voltage having an opposite polarity as the first dechuck voltage;
linearly sweep the voltage on the ESC from the first dechuck voltage to the second dechuck voltage over a second time interval using the power source;
monitor, using the current monitoring device, a current of the ESC during the second time interval until a spike in the current of the ESC above a threshold is detected;
in response to the detection of the spike in the current of the ESC above the threshold, communicating a command from the system controller to a controller of the processing chamber to move up pins supporting the processing object to remove the processing object from the surface of the ESC; and
maintain the second dechuck voltage using the power source until the processing object is separated from the surface of the ESC.

18. The system of claim 17, wherein the current monitoring device and the system controller comprise a unitary device.

19. The system of claim 17, wherein the current monitoring device, the power source and the system controller comprise a unitary device.

20. The system of claim 17, wherein the threshold for the spike in the current of the ESC comprises a current level at least several microamperes above a stable current level during the linear voltage sweep.

* * * * *